United States Patent
Yu

(10) Patent No.: US 9,229,030 B2
(45) Date of Patent: Jan. 5, 2016

(54) TESTING APPARATUS AND METHOD USING SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Qi-Long Yu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 204 days.

(21) Appl. No.: 13/906,310

(22) Filed: May 30, 2013

(65) Prior Publication Data

US 2013/0321014 A1    Dec. 5, 2013

(30) Foreign Application Priority Data

May 30, 2012   (CN) .......................... 2012 1 01722364

(51) Int. Cl.
   *G01R 1/067*     (2006.01)
   *G01R 31/28*     (2006.01)

(52) U.S. Cl.
   CPC ............ *G01R 1/067* (2013.01); *G01R 1/06705* (2013.01); *G01R 31/2808* (2013.01)

(58) Field of Classification Search
   CPC ............... G01R 1/06705; G01R 1/067; G01R 31/2808; G01R 31/2831; G01R 31/2875; G01R 31/2889; G01R 31/2891; H01M 8/248

USPC ................. 324/750.18, 600, 750.22, 754.03, 324/756.03, 762.03

See application file for complete search history.

(56) References Cited

U.S. PATENT DOCUMENTS

| | | | | |
|---|---|---|---|---|
| 6,127,729 | A * | 10/2000 | Fukuda ................... | H01L 22/34 257/208 |
| 6,305,230 | B1 * | 10/2001 | Kasukabe .......... | G01R 31/2889 73/855 |
| 2009/0219046 | A1 * | 9/2009 | Yamada et al. ................ | 324/758 |
| 2009/0239316 | A1 * | 9/2009 | Li .................................... | 438/17 |
| 2010/0164520 | A1 * | 7/2010 | Kiyofuji et al. ................ | 324/754 |
| 2010/0213960 | A1 * | 8/2010 | Mok et al. ....................... | 324/755 |
| 2011/0115512 | A1 * | 5/2011 | Miller ................ | G01R 1/06766 324/754.03 |
| 2011/0221450 | A1 * | 9/2011 | Lee et al. ......................... | 324/600 |
| 2012/0136614 | A1 * | 5/2012 | Liu et al. ......................... | 702/122 |

\* cited by examiner

*Primary Examiner* — Tung X Nguyen
*Assistant Examiner* — David Frederiksen
(74) *Attorney, Agent, or Firm* — Novak Druce Connolly Bove + Quigg LLP

(57) ABSTRACT

A testing apparatus for testing a number of different characteristics of a circuit board includes at least two probes, at least one measuring meter, and a storage device. After a circuit schematic diagram of the circuit board and a circuit wiring diagram of the circuit board have been compared, the location of each electric contact is determined. The probes necessary for testing particular characteristics are connected in turn to the measuring meter. The circuit board is moved to align the electric contacts with the probes, and bring the probes into electrical contact with the electric contacts for testing.

16 Claims, 2 Drawing Sheets

TESTING APPARATUS AND METHOD USING SAME

TECHNICAL FIELD

The disclosure generally relates to testing technologies, and particularly to a testing apparatus and method.

DESCRIPTION OF RELATED ART

When a circuit board is tested, testing contacts on the circuit board are found one after another and manually selected using a measuring meter according to an electric parameter. Therefore, if the circuit board is very complicated, it takes a long time to test many electric contacts and different corresponding electric parameters of the circuit board, which leads to a low testing efficiency.

Therefore, it is desirable to provide a means which can overcome the above-mentioned problems.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable median include CDs, DVDs, BLU-RAY, flash memory, and hard disk drives.

Figure 1:
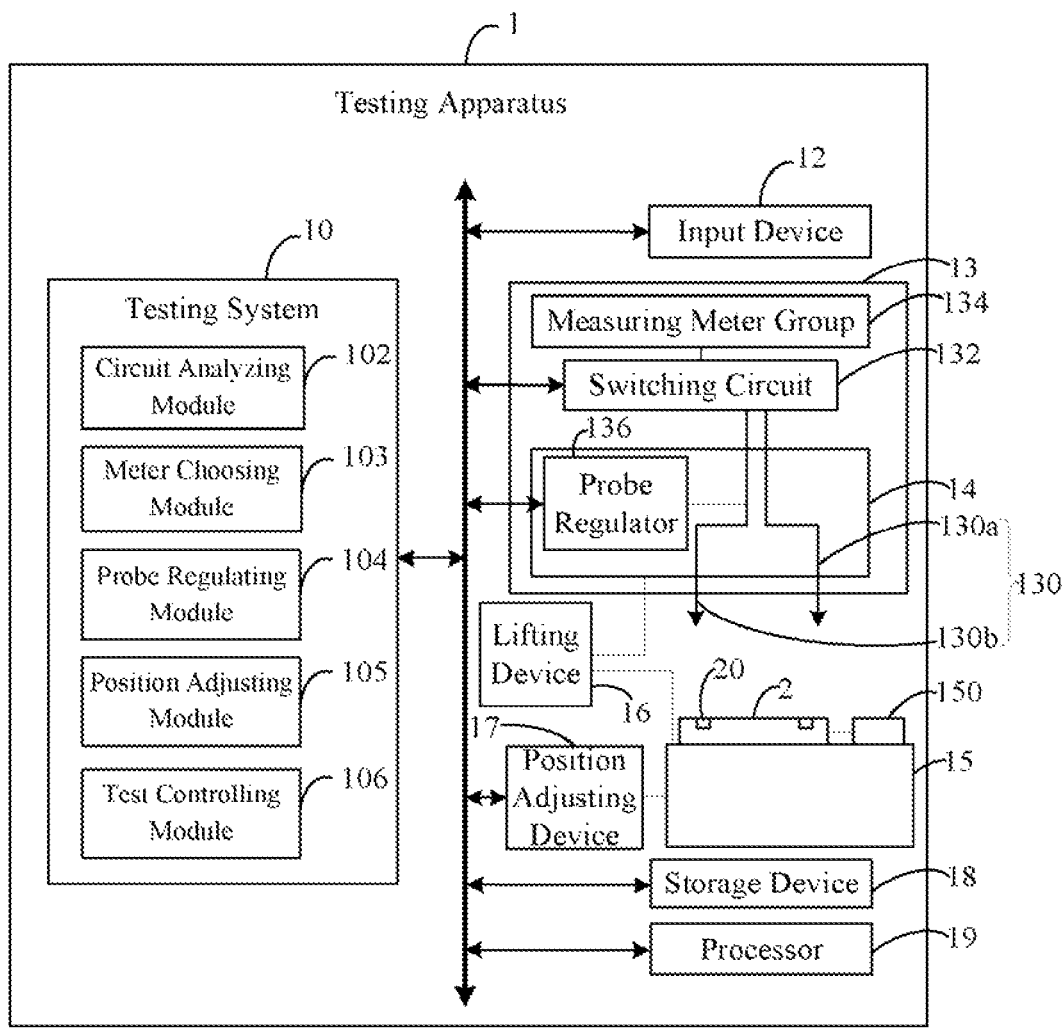
FIG. 1 is a block diagram of one embodiment of a testing apparatus.

FIG. 1 is a block diagram of one embodiment of a testing apparatus 1. The testing apparatus 1 is configured to test a number of different characteristics of a circuit board 2. The characteristics may be, but are not limited to, a voltage value, a current value, and a electrical resistance. The testing apparatus 1 includes an input device 12, a testing device 13, an upper holding board 14 for holding the testing device 13, a lower holding board 15 for holding a circuit board 2, a lifting device 16, a position adjusting device 17, a storage device 18, and at least one processor 19. The input device 12, the testing device 13, the lifting device 16, the position adjusting device 17, the storage device 18, and the at least one processor 19 are directly or indirectly electronically interconnected.

The input device 12 is configured to input testing requirements. The content of the testing requirements may be, but are not limited to, a number of electric contacts 20 on the circuit board 2 and a number of characteristics to be tested on the electric contacts 20. The input device 12 may be, but is not limited to, a keyboard, a mouse, a microphone, or a touch display. For example, the circuit board 2 can be shown on the touch display. A user clicks the electric contacts 20 of the circuit board 2 via the touch display, selects an option of the characteristics via the mouse, or types a name of the characteristic to be tested, via the keyboard.

The testing device 13 includes a number of probes 130, a switching circuit 132, a measuring meter group 134, and a probe regulator 136. The probes 130 are set on the upper holding board 14 and extend towards the lower holding board 15. The measuring meter group 134 includes a number of measuring meters configured to measure different characteristics of the circuit board 2. The measuring meters may be, but are not limited to, a digital multimeter, an oscilloscope, and a frequency counter. The probes 130 are connected to a number of input terminals of the measuring meters and transmit electrical signals of the circuit board 2 to the measuring meters. The number of probes 130 depends on the number of input terminals of the measuring meter. Because the measuring meter needs to form a test loop with an electronic element of circuit board 2, the measuring meter includes at least two input terminals. Correspondingly, the testing device 13 includes at least two probes 130. The switching circuit 132 connects the input terminals of the different measuring meters with the probes 130 according to the characteristics to be tested. The probe regulator 136 regulates relative positions among the different probes 130. In this embodiment, the switching circuit 132 is a relay. The testing device 13 includes a fixed probe 130a and a moving probe 130b. The probe regulator 136 drives the moving probe 130b to move relative to the fixed probe 130a on the upper holding board 14 for regulating a distance between the fixed probe 130a and the moving probe 130b. The probe regulator 136 is a stepper motor.

The lifting device 16 adjusts a relative position between the upper holding board 14 and the lower holding board 15 to bring the probes 130 into electrical contact with the electric contacts 20 of the circuit board 2 held on the lower holding board 15. In this embodiment, the lifting device 16 is a pneumatically-driven pressing machine.

The lower holding board 15 faces the upper holding board 14 and includes a testing circuit 150 to provide a number of predetermined testing conditions for the circuit board 2, for example, a predetermined voltage or a predetermined current.

In this embodiment, the lower holding board 15 is fixed. The position adjusting device 17 moves the circuit board 2 on the lower holding board 15 to align the electric contacts 20 on the circuit board 2 with the probes 130. It is understand that, in an alternative embodiment, the circuit board 2 is fixed on the lower holding board 15, and the position adjusting device 17 moves the lower holding board 15 to align the electric contacts 20 on the circuit board 2 with the probes 130 on the upper holding board 14.

The storage device 18 may be, but is not limited to, a hard disk, or a dedicated memory, such as an EPROM, HDD, or flash memory. The storage device 18 stores a circuit schematic diagram and a circuit wiring diagram of the circuit board 2. The circuit schematic diagram of the circuit board 2 schematically shows connections among each electronic component of the circuit board 2 to illustrate a working principle of the circuit board 2, but is not an actual wiring pattern of the circuit board 2. The circuit wiring diagram shows the actual wiring pattern of the circuit board 2. The storage device 18 also stores the characteristics for testing in different testing conditions to be ready for a further analysis of the circuit board 2.

The testing system 10 includes a circuit analyzing module 102, a meter choosing module 103, a probe regulating module 104, a position adjusting module 105, and a test controlling module 106. Computerized codes of the testing system 10 can be embedded into an operating system of the testing apparatus 1, or stored in the storage device 18 and executed by the processor 19.

To determine the location of the electric contacts 20 on the circuit board 2, the circuit analyzing module 102 matches the circuit schematic diagram with the circuit wiring diagram. The locations of each of the electric contacts 20 are described in a polar coordinate system. The polar coordinate system is established with a vertical projection point of the fixed probe 130a on the lower holding board 15 as one pole thereof and with a direction from the pole to a vertical projection of the moving probe 130b as the polar axis thereof. A center of the circuit board 2 aligns with the pole. Therefore, each electric contact 20 on the circuit board 2 can be determined by a radial coordinate and an angular coordinate of the polar coordinate system. The circuit analyzing module 102 matches the electric contacts 20 selected on the circuit schematic diagram by the user with a number of actual electric contacts 20 on the circuit wiring diagram, determines the coordinates of the actual electric contacts 20 on the circuit board 2, and sends the coordinates of the actual electric contacts 20 to the probe regulating module 104 and the position adjusting module 105. The circuit analyzing module 102 also determines a predicted voltage of each electric contact 20 as a reference to choose the input terminals of the measuring meter.

The meter choosing module 103 controls the switching circuit 132 to connect the input terminals of the measuring meter corresponding to the required characteristics with the probes 130 when characteristics to be tested are input via the input device 12.

The probe regulating module 104 controls the probe regulator 136 to regulate the distance between the probes 130 according to the coordinates of the actual electric contacts 20. The distance between the probes 130 is regulated to be equal to a distance between the actual electric contacts 20.

The position adjusting module 105 controls the position adjusting device 17 to move the circuit board 2 to align the electric contacts 20 to be tested on the circuit board 2 with the probes 130 according to the coordinates of the actual electric contacts 20, the predicted voltage of the electric contacts 20, and the connections between the probes 130 and the input terminals of the measuring meter.

The test controlling module 106 controls the lifting device 16 to move the upper holding board 14 towards the lower holding board 15 and bring the probes 130 into contact with the electric contacts 20 to be tested. The test controlling module 106 controls the testing circuit 150 to provide the predetermined testing conditions to the circuit board 2 when the probes 130 make contact with the electric contacts 20 to be tested and stores data as to the characteristics discovered by the measuring meters, in the storage device 18.

Figure 2:
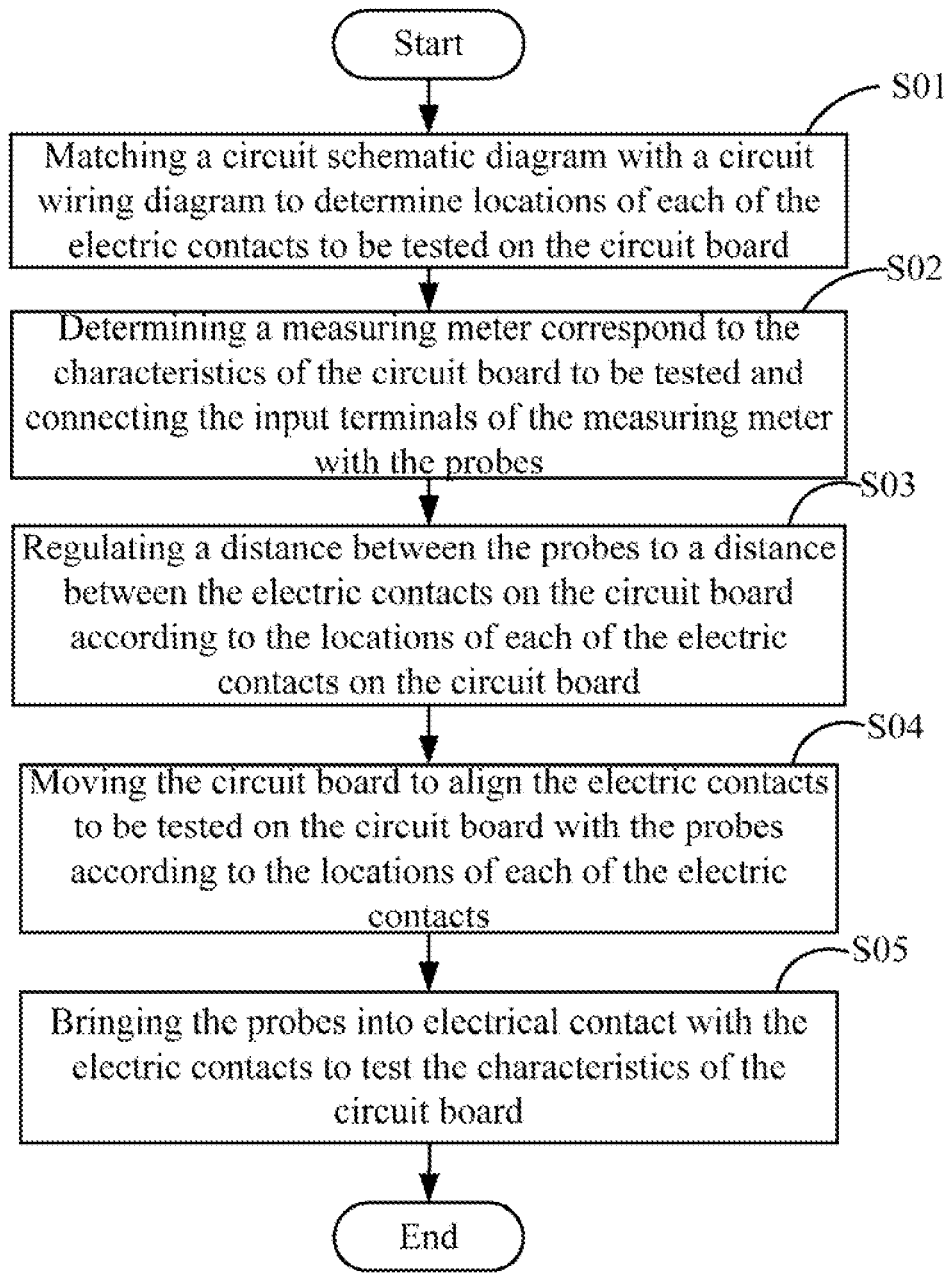
FIG. 2 is a flowchart of an exemplary embodiment of a testing method.

FIG. 2 is a flowchart of an exemplary embodiment of a testing method. Depending on the embodiment, additional steps may be added, others deleted, and the ordering of the steps may be changed.

In step S01, the circuit analyzing module 102 matches the circuit schematic diagram with the circuit wiring diagram to determine the locations of each of the electric contacts 20 to be tested on the circuit board 2.

In step S02, the meter choosing module 103 determines the measuring meter corresponding to the characteristic to be tested to be tested and controls the switching circuit 132 to connect the input terminals of the measuring meter with the probes 130. The input terminals are connected to the probes 130 via the switching circuit 132.

In step S03, the probe regulating module 104 controls the probe regulator 136 to regulate the distance between the probes 130 to the distance between the actual electric contacts 20 on the circuit board 2 according to the location of the electric contacts 20 on the circuit board 2.

In step S04, the position adjusting module 105 controls the position adjusting device 17 to move the circuit board 2 to align the electric contacts 20 to be tested with the probes 130 according to the locations of the electric contacts 20 determined by the circuit analyzing module 102.

In step S05, the test controlling module 106 controls the lifting device 16 to bring the probes 130 into contact with the electric contacts 20 to be tested. The test controlling module 106 controls the testing circuit 150 to provide the predetermined testing conditions to the circuit board 2 when the probes 130 make contact with the electric contacts 20 and stores data concerning the characteristics tested by the measuring meters in the storage device 18.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A testing apparatus for testing a circuit board comprising electrical contacts, the testing apparatus comprising:
   a testing device comprising two probes and at least one measuring meter, wherein a distance between the two probes is adjustable and each measuring meter comprises at least two input terminals;
   a position adjusting device aligning the electric contacts of the circuit board with the probes;
   a lifting device bringing the probes into electrical contact with the electric contacts of the circuit board;
   a storage device storing a circuit schematic diagram and a circuit wiring diagram of the circuit board, wherein the circuit schematic diagram of the circuit board schematically shows connections among each electrical contact of the circuit board to illustrate a working principle of the circuit board, and the circuit wiring diagram shows an actual wiring pattern of the circuit board;
   a processor; and
   a testing system executed by the processor, the testing system comprising:
   a circuit analyzing module that matches the circuit schematic diagram with the circuit wiring diagram to determine a location of each of the electric contacts on the circuit board and determines a predicted voltage of each electric contact;
   a meter choosing module that chooses one of the at least one measuring meter according to a characteristics of the circuit board to be tested and connects the input terminals of the chosen measuring meter with the probes;
   a probe regulating module that regulates the distance between the two probes to a distance between the electric contacts;
   a position adjusting module that controls the positioning device to align the electric contacts to be tested with the probes according to the location of each of the electric contacts, the predicted voltage of the electric contacts, and the connections between the probes and the input terminals of the chosen measuring meter; and a test controlling module that controls the lifting device to bring the probes into electrical contact with the electric contacts to be tested to make the chosen measuring meter to test the characteristics of the circuit board.

2. The testing apparatus of claim 1, further comprising an input device inputting testing requirements, wherein the testing requirements comprise the electric contacts to be tested and the characteristics to be tested related to the electric contacts to be tested.

3. The testing apparatus of claim 2, wherein the input device is selected from the group consisting of a keyboard, a mouse, a microphone, and a touch display.

4. The testing apparatus of claim 1, further comprising an upper holding board for holding the testing device and a lower holding board facing the upper holding board for holding the circuit board, wherein the lifting device is configured to adjust a relative position between the upper holding board and the lower holding board to bring the probes into electrical contact with the electric contacts of the circuit board held on the lower holding board.

5. The testing apparatus of claim 4, wherein the testing device further comprises a probe regulator regulating relative positions among the two probes, the probe regulating module controls the probe regulator to regulate the distance between the two probes according to the location of each of the electric contacts to be tested.

6. The testing apparatus of claim 5, wherein the probe regulator is a stepper motor.

7. The testing apparatus of claim 5, wherein the two probes of the testing device comprise a fixed probe and a moving probe, the probe regulator drives the moving probe to move relative to the fixed probe on the upper holding board for regulating a distance between the fixed probe and the moving probe.

8. The testing apparatus of claim 7, wherein the location of each of the electric contacts on the circuit board is described in a polar coordinate system, the polar coordinate system is established with a vertical projection point of the fixed probe on the lower holding board as one pole of the polar coordinate system and with a direction from the pole to a vertical projection of the moving probe as the polar axis of the polar coordinate system, a center of the circuit board aligns with the pole.

9. The testing apparatus of claim 4, wherein the lower holding board is fixed, the position adjusting device moves the circuit board on the lower holding board to adjust a relative location between the electric contacts on the circuit board with the probes.

10. The testing apparatus of claim 4, wherein the circuit board is fixed on the lower holding board, and the position adjusting device moves the lower holding board to adjust the relative location of electric contacts on the circuit board with the probes on the upper holding board.

11. The testing apparatus of claim 1, wherein the testing device further comprises a switching circuit connecting the input terminals of the chosen measuring meter with the two probes according to the characteristics to be tested, the meter choosing module controls the switching circuit to connect the input terminals of the chosen measuring meter corresponding to the characteristics with the two probes.

12. The testing apparatus of claim 11, wherein the switching circuit is a relay.

13. The testing apparatus of claim 1, wherein the lifting device is a pneumatically-driven pressing machine.

14. A testing method being performed by execution of computer readable program code by a processer of a testing apparatus to test a plurality of different characteristics on a plurality of electric contacts of a circuit board, the testing apparatus comprising two probes, at least one measuring meter, and a storage device, each measuring meter comprising at least two input terminals, the storage device storing a circuit schematic diagram of the circuit board for showing connections among each electronic component of the circuit board to illustrate a working principle of the circuit board and a circuit wiring diagram of the circuit board for showing an actual wiring pattern of the circuit board, the method comprising:

matching the circuit schematic diagram with the circuit wiring diagram to determine the location of each of the electric contacts to be tested on the circuit board;

determining one of the at least one measuring meter according to the characteristics of the circuit board to be tested and connecting the input terminals of the determined measuring meter with the probes;

regulating a distance between the two probes to a distance between the electric contacts on the circuit board according to the location of each of the electric contacts on the circuit board;

moving the circuit board to align the electric contacts to be tested on the circuit board with the two probes according to the location of each of the electric contacts; and bringing the two probes into electrical contact with the electric contacts to test the characteristics of the circuit board.

15. The method as claimed in claim 14, wherein the two probes of the testing apparatus comprises an upper holding board, a lower holding board facing the upper holding board, a fixed probe, and a moving probe, the fixed probe and the moving probe is set on the upper holding board, the moving probe is movable on the upper holding board relative to the fixed probe, the circuit board is held on the lower holding board.

16. The method as claimed in claim 15, wherein the location of each of the electric contacts on the circuit board is described in a polar coordinate system, the polar coordinate system is established with a vertical projection point of the fixed probe on the lower holding board as one pole of the polar coordinate system and with a direction from the pole to a vertical projection of the moving probe as the polar axis of the polar coordinate system, a center of the circuit board aligns with the pole.

* * * * *